United States Patent
Jacobowitz et al.

(10) Patent No.: US 7,764,132 B2
(45) Date of Patent: Jul. 27, 2010

(54) ALL DIGITAL FREQUENCY-LOCKED LOOP CIRCUIT METHOD FOR CLOCK GENERATION IN MULTICORE MICROPROCESSOR SYSTEMS

(75) Inventors: Lawrence Jacobowitz, Wappingers Falls, NY (US); Daniel J. Stigliani, Jr., Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 12/182,204

(22) Filed: Jul. 30, 2008

(65) Prior Publication Data

US 2010/0026352 A1 Feb. 4, 2010

(51) Int. Cl.
*H03K 3/03* (2006.01)
(52) U.S. Cl. .............................. 331/57; 331/16; 718/104
(58) Field of Classification Search ................... 331/16, 331/57; 718/104
See application file for complete search history.

(56) References Cited

U.S. PATENT DOCUMENTS

| | | | |
|---|---|---|---|
| 7,162,000 B2 | 1/2007 | Stengel et al. | |
| 7,282,971 B2 | 10/2007 | Panpalia et al. | |
| 7,505,542 B1 * | 3/2009 | Lesea | 375/374 |
| 2003/0151433 A1 | 8/2003 | Takai | |
| 2007/0004116 A1 | 2/2007 | Hshieh | |
| 2009/0288092 A1 * | 11/2009 | Yamaoka | 718/104 |

* cited by examiner

*Primary Examiner*—Robert Pascal
*Assistant Examiner*—James E Goodley
(74) *Attorney, Agent, or Firm*—Cantor Colburn LLP; Steven Chiu

(57) ABSTRACT

A (DFLL) circuit residing on a local core of a multi-core microprocessor for generating a local core clock with a frequency for driving the local core includes a micro-controller configured to receive core characterizing digital data; a ring oscillator configured to generate the local core clock for the local core, and having a delay chain disposed between an output and a feedback input of the ring oscillator, the delay chain having delay taps each receiving the local core clock enabling quantum changes in the frequency of the local core clock; and a counter device configured to continually validate the frequency by generating a digital signal representative of the frequency to the micro-controller, the micro-controller compares the frequency of the local core clock to a desired clock frequency, and selects one of the delay taps based on the comparison to adjust the frequency value of the local core clock.

20 Claims, 5 Drawing Sheets

ALL DIGITAL FREQUENCY-LOCKED LOOP CIRCUIT METHOD FOR CLOCK GENERATION IN MULTICORE MICROPROCESSOR SYSTEMS

BACKGROUND

This invention relates to a system and method for clock generation in multi-core microprocessor systems.

Servers are beginning to exploit a multiplicity of multi-core processor chips in order to continue to increase performance, as processor frequency scaling can no longer meet the industry growth in performance. Also, the increasing difficulty and hardware cost, as well as signal integrity concerns, associated with the transmission of high frequency clocking throughout a multi-chip and multi-core processor server make this untenable long-term strategy for future server systems. The state of the art for clock distribution is based on high-speed analog signals using transmission lines. This technique is limited in scalability due to skin effect, media and connector loss, crosstalk, termination mismatches, etc.

Today's large servers contain, for example, greater than ten processor chips typically containing two cores. It is expected both chips and cores per chip will increase in the future. Transmission of high frequency clocks (>5-10 GHz) for multiple chips comprised of multiple cores is not feasible with known board technology and connectors. The need to operate this configuration in a tightly coupled mode, such as a symmetric multi-processor (SMP), will require a new clocking paradigm.

As microprocessor chips become larger with more cores, regional process and parameter variability across chip means that each core will have an optimal power/performance metric at different chip voltage and clock frequency setting. Obtaining optimum performance for each core within a multi-core system is not feasible today. Separate core voltage domains are known and state-of-the-art but they can only serve to optimize the power at the chip level and not obtain optimum core performance. A server system with separate frequency domains per core is very complicated and is not practiced in the industry. For example, multiple off-chip and on-chip oscillators are required. Spread spectrum clocking used for electronic-magnetic interference (EMI) reduction with multiple oscillators makes "synchronous spreading" very difficult or impossible. Prior art technology is based on distribution of clocking signals across a wiring network known as a clock-trees. With the growth in the number of cores in multi-core microprocessors, clock-tress also grow into enormous complexity, creating serious chip layout design difficulties and translating into detractors to final product yield and related increase in manufacturing cost.

SUMMARY

An exemplary embodiment of a digital frequency locked-loop (DFLL) circuit residing on a local core of a multi-core microprocessor system for generating a local core clock with a frequency value for driving the local core is provided. The DFLL circuit, comprising: a micro-controller configured to receive a plurality of digital data for characterizing the local core; a digitally-controlled ring oscillator configured to generate the local core clock for the local core, the digitally-controlled ring oscillator having a delay chain disposed between an output of the digitally-controlled ring oscillator and a feedback input of the digitally-controlled ring oscillator, the delay chain having a plurality of delay taps each receiving the local core clock from the output through the feedback input of the digitally-controlled ring oscillator for enabling single or multi-step quantum changes in the frequency value of the local core clock; and a counter device configured to continually validate the frequency value of the local core clock by generating a digital signal representative of the frequency value to the micro-controller, the micro-controller compares the frequency value of the local core clock to a desired clock frequency when the micro-controller receives the digital signal from the counter device, and the micro-controller selects one of the plurality of delay taps based on the comparison to adjust the frequency value of the local core clock towards alignment with the desired clock frequency.

An exemplary embodiment of a method for tuning the frequency of a local core clock configured to drive a local core in a multi-core microprocessor system is provided. The method comprising: disposing a digital frequency locked-loop (DFLL) circuit on the local core; generating a digital signal representative of the frequency of the local core clock to a micro-controller of the DFLL circuit when the frequency of the local core clock is validated by a counter device of the DFLL circuit; comparing the frequency of the local core clock to a desired clock frequency when the micro-controller receives the digital signal from the counter device; and selecting one of a plurality of delay taps of a delay chain in a digitally-controlled ring oscillator of the DFLL circuit based on the comparison to adjust the frequency of the local core clock towards alignment with the desired clock frequency, the plurality of delay taps each receive the local core clock from an output end of the digitally controlled ring oscillator, the plurality of delay taps enable single or multi-step quantum changes in the frequency of the local core clock.

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The inventors herein have recognized a new circuit based on a totally digital frequency locked-loop to generate clocks of variable frequency at the local core level of a multi-core processing system. More specifically, the inventors herein have recognized a new circuit method having an all digital frequency locked-loop in which a local digital frequency reference provides a known transfer function serving as a calibration metric enabling a stable reference initial frequency to be tuned in quantized steps to generate a local core clock of variable frequency. In exemplary embodiments described herein, the initial frequency is tuned based on a selectable number of quantized steps of frequency using time-delay elements in a ring oscillator device structure. The inventors herein have further recognized a unique frequency counter method for enabling rapid changes in the core clock frequency. The inventors herein have even further recognized that with event monitoring devices for workload and power consumption management, autonomic servo-control across the available core resources becomes inherent to the design of multi-core processors.

Figure 1:
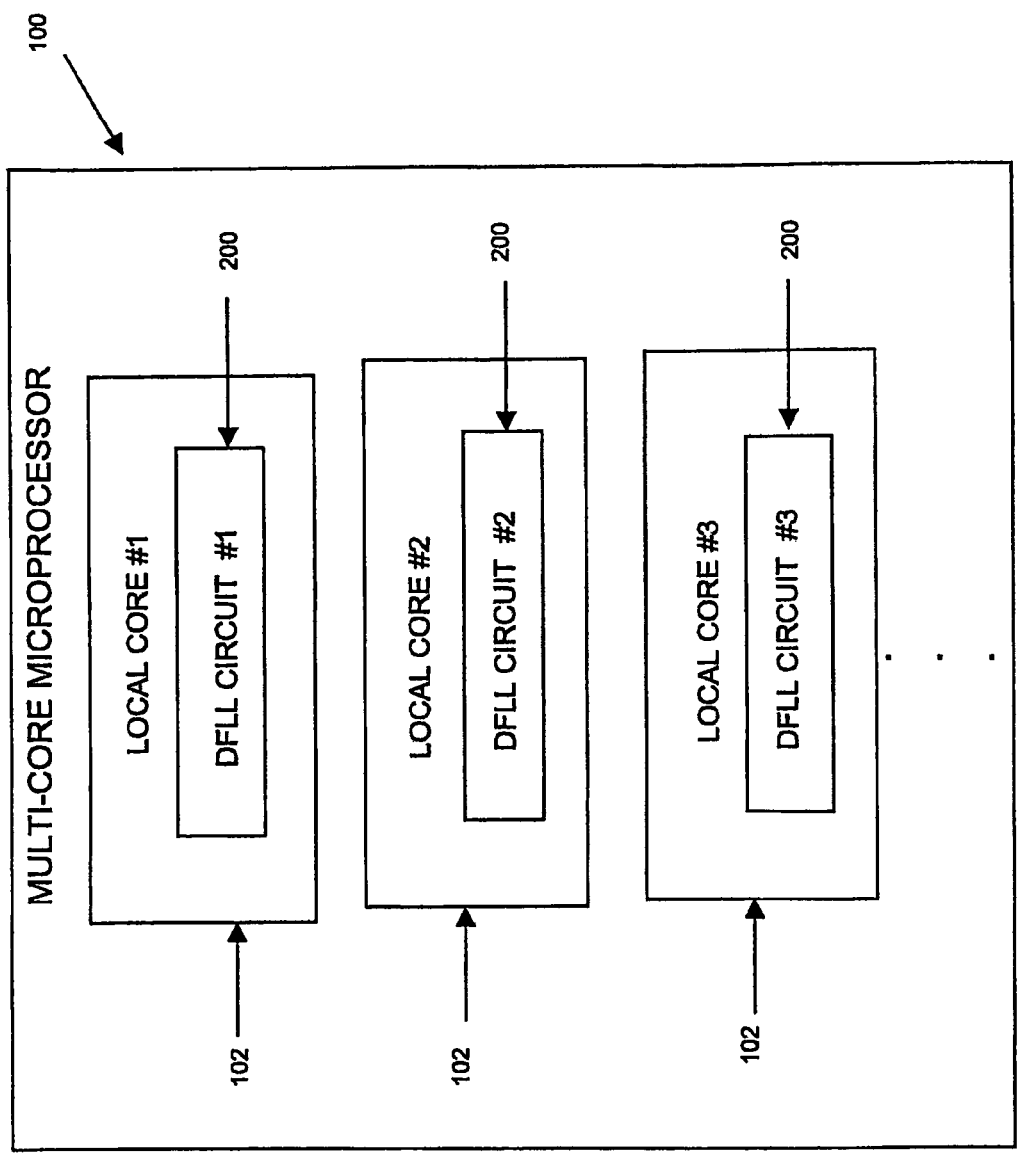
FIG. 1 illustrates a schematic of a multi-core processing system having multiple chips in accordance with one exemplary embodiment of the present invention.
Figure 2:
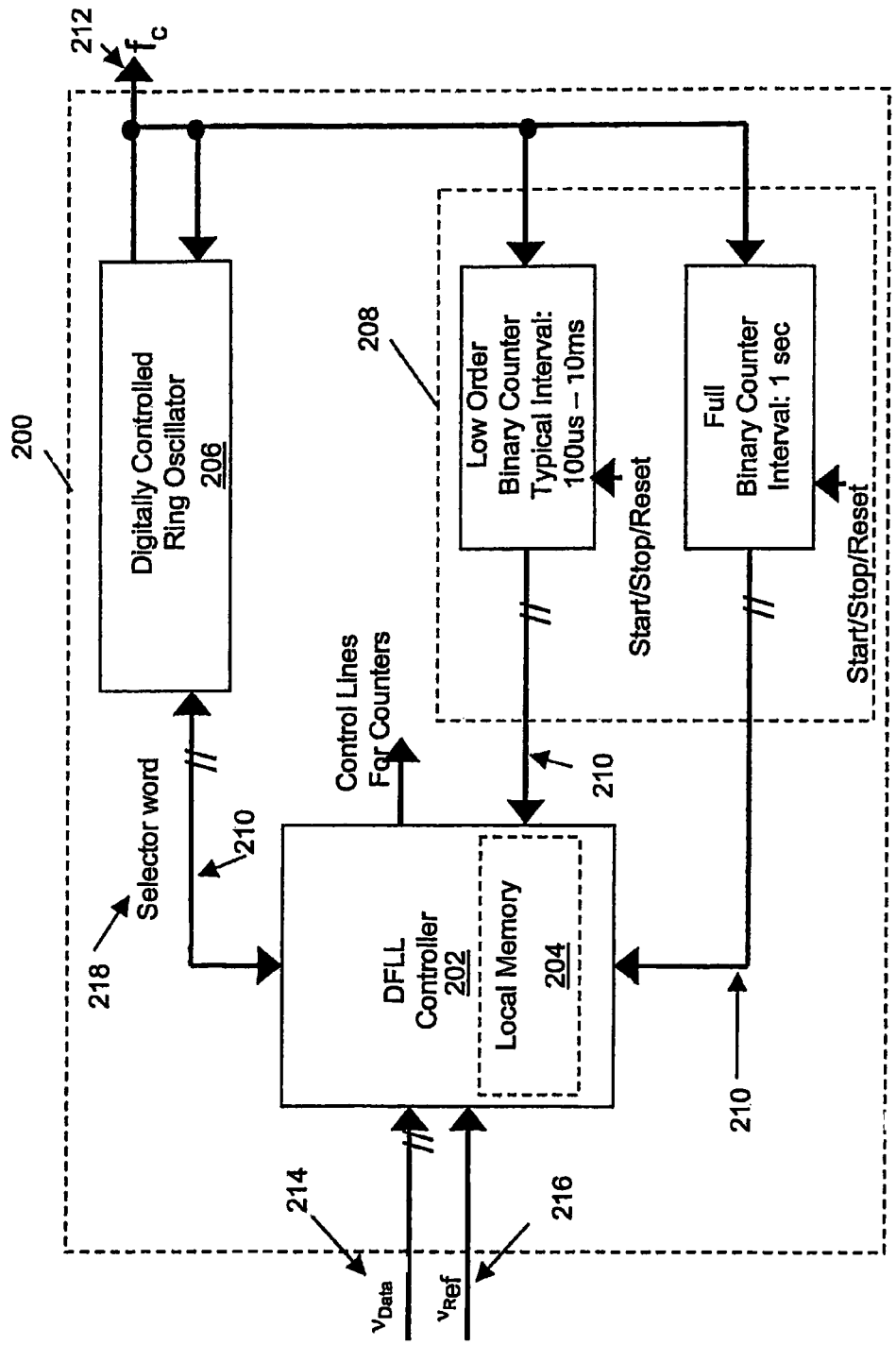
FIG. 2 illustrates a block diagram of digital frequency locked-loop (DFLL) circuit in accordance with one exemplary embodiment of the present invention.

Referring now to the drawings, FIG. 1 is a schematic of a multi-core processor chip 100 having local cores 102 each with a high-level design of a digital frequency locked-loop (DFLL) circuit 200 in accordance with one exemplary embodiment of the present invention. The DFLL circuit 200 is configured to reside in a local core of a multi-core processor system 100, thereby providing a local clock for each core within the multi-core processor system 100 that enables the frequency of a local clock for a core within the system 100 to be tuned differently from another local clock belonging to another core within the system 100. For ease of discussion, only the local core (e.g., local core #1) incorporating DFLL circuit 200 is described in greater detail and is illustrated in FIG. 2. However, it should be understood that a digital frequency locked-loop circuit as will be described herein can be incorporated in each of the local cores of the multi-core processor system which may be comprised of a plurality of multi-core processor chips.

The DFLL circuit 200 comprises a DFLL micro-controller 202 having a local memory device 204, a digitally controlled ring oscillator 206, and a counting device 208. The DFLL micro-controller 202 is in signal communication with the digitally controlled ring oscillator 206 and the counting device 208. The DFLL micro-controller 202, the digitally controlled ring oscillator 206 and the counting device 208 together form a total feedback network. In accordance with one exemplary embodiment, the DFLL micro-controller 202 communicates with the digitally controlled ring oscillator 206 and the counting device 208 via a parallel data bus interface 210 as shown. The DFLL circuit 200 generates a local core clock 212 with variable frequency, indicated by signal $f_c$, used for driving a local core (e.g., local core #1) in the multi-core processor system. More specifically, the digitally controlled ring oscillator 206 generates the local core clock 212, which is described herein as the actual clock frequency.

In accordance with one embodiment, the DFLL micro-controller 202 executes instructions by fetching both instructions and data from local memory device 204. The DFLL micro-controller 202 can be any conventional processing unit configured for carrying out the methods and/or functions described herein. In one exemplary embodiment, the DFLL micro-controller 202 comprises a combination of hardware and/or software/firmware with a computer program that, when loaded and executed, permits the DFLL micro-controller 202 to operate such that it carries out the methods described herein.

In particular, the DFLL micro-controller 202 operably receives data input 214, indicated by signal $v_{data}$, and a reference clock 216 having a known frequency, indicated by signal $v_{ref}$. A desired clock frequency value for the local core clock 210 is contained with data input 214, which may comprise of one or more data tables or look-up tables and is set by customer policy for which optimization parameters are to be chosen (e.g., performance vs. power dissipation at a given temperature, as a function of voltage, aging, etc). The DFLL micro-controller 202 enables the local core clock 212 to be tuned to varying frequencies based on data input 214 and changing customer policy.

In accordance with one embodiment, the DFLL micro-controller 202 operably receives $v_{data}$ from a serial electrically erasable programmable read only memory (SEEPROM) (not shown). The $v_{data}$ is stored as digital data in the SEEPROM and is a digital representation of the optimum core frequency or desired clock frequency along with the identification of the appropriate chip and local core to which the data is directed. The identification information is used to insure the data is transmitted and stored on the correct chip and on the correct local core. Data input 214 is derived from frequency characterization data, voltage characterization data, power characterization data, etc., which are gathered by a service element (SE) (not shown) in accordance with one embodiment. The SE analyzes and reformats the data and loads the data in the system SEEPROM via a suitable digital interface and effectively loads the data into the local memory device 204. The totality of the data input 214 gathered and analyzed by the SE is used to set the optimum frequency, voltage, etc. for each local core in the system to achieve the highest performance possible or other policy established by a customer. As such, the data to set the core clock frequency is generated locally. Data input 214 may be obtained or derived during the chip test/verification stage in the manufacturing process or as part of a training paradigm during initial power on of the server. Data input 214 is addressable data and can be changed and loaded onto the SEEPROM as the customer sees fit.

The DFLL micro-controller 202 receives the reference clock 216, which is a low frequency clock input used to strobe or clock $v_{data}$ and enables accurate timing marks. The reference clock 216 is further used to clock the DFLL micro-controller 202 as well as to define the timing for binary frequency counters in the counting device 208, which will described in more detail below. The accuracy of the timing marks can be determined by a crystal oscillator, which is temperature controlled, or by a Cesium (Cs) atomic clock depending on the desired configuration.

In accordance with one embodiment, the DFLL micro-controller 202 digitally measures the difference between the actual frequency of the local core clock 212 as determined by the counting device 208 in accordance with one embodiment, and the desired clock frequency as established by data input 214. The DFLL micro-controller 202 generates a selector word or a correction signal 218 to the digitally controlled ring oscillator 206 based on the comparison. The selector word 218 is used to adjust the ring oscillator 206 to bring the actual frequency of the local core clock 210 into alignment with the desired clock frequency.

Figure 3A:
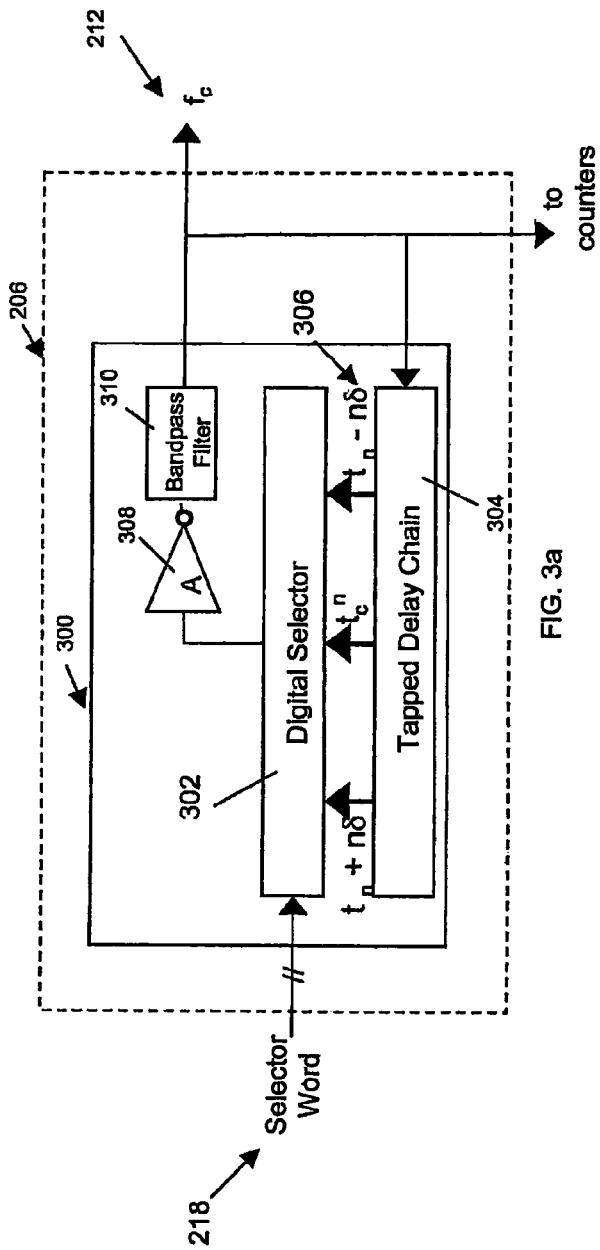
FIG. 3a illustrates a schematic of a digitally controlled ring oscillator of the DFLL circuit in accordance with one exemplary embodiment of the present invention.

Referring now to FIG. 3a, the digitally controlled ring oscillator 206 comprises a ring oscillator 300 having a digital selector 302, a tapped delay chain 304 with delay taps 306, an amplifier 308, and a band-pass filter 310 along with other conventional components of a standard ring oscillator. The number of delay taps 306 (n) within the delay chain 304 is determined by a user to obtain the frequency range of operation and the granularity desired and should not be limited to the number illustrated in FIG. 3a. The delay taps 306 of the tapped delay chain 304 in the feedback path of the local core clock 212 are a range of frequencies used to tune or adjust the frequency of the local core clock 212 to the desired clock frequency. In accordance with one embodiment, the delay taps 306 are arranged where the tap near the beginning of the tapped delay chain 304 increases the frequency of the ring oscillator 300 while the tap near the end of the tapped delay chain 304 decreases the frequency of the ring oscillator 300, thereby effectively increasing or decreasing the frequency of the local core clock 212 accordingly. The middle of the tapped delay chain 304 is the center of the desired range of frequencies based on the desired application requirements. During operation, the digital selector 302 selects one of the delay taps 306 of the tapped delay chain 304 based on the selector word 218 and feeds the selected delay tap into the amplifier 308 and effectively into the band-pass filter 310 to adjust the frequency of the local core clock 212 generated by the ring oscillator 300.

Figure 3B:
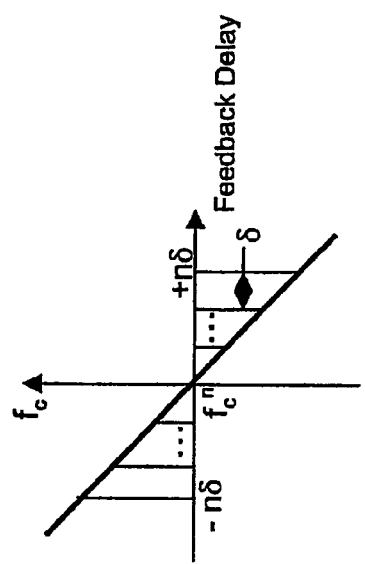
FIG. 3b illustrates an exemplary graph of a transfer function for calibrating a plurality of time delays correspondingly associated with a plurality of delay taps in a delay chain of the digitally controlled ring oscillator in accordance with one exemplary embodiment of the present invention.

In accordance with one embodiment, the frequency of oscillations of the ring oscillator 300 is determined by the center delay $t_c^n$, which is the nominal value of delay. The range of frequency oscillations is determined by $+/-n\delta$, where n is the total number of delay taps 306 in the tapped delay chain 304 and delta ($\delta$) is the uniform time delay value or difference between two consecutive taps as illustrated with an exemplary transfer function of frequency versus delay shown in FIG. 3b. The delay difference between two consecutive delay taps 304 may be non-uniform to achieve desired affects. This enables non-linear deltas within the tapped delay chain 304. The user selects a center frequency $f_c^n$ and a range of frequencies for the digitally controlled ring oscillator 206 based on the number of delay taps 206 of the tapped delay chain 304 to achieve the frequency desired.

In accordance with one embodiment, data input 214 contains the transfer function, which can be adjusted by the user during the chip test/verification state in the manufacturing process or as part of a training paradigm during initial power on of the server. The transfer function is programmable to the digitally controlled ring oscillator 206 and is stored in the local memory device 204. The transfer function calibrates the time delays ($\delta$) correspondingly associated with the delay taps 306 in accordance with one embodiment. As such, the time delays and effectively the range of frequencies can be changed as desired and as frequently by uploading a modified transfer function to the DFLL micro-controller 202 and the digitally controlled ring oscillator 206.

Figure 4:
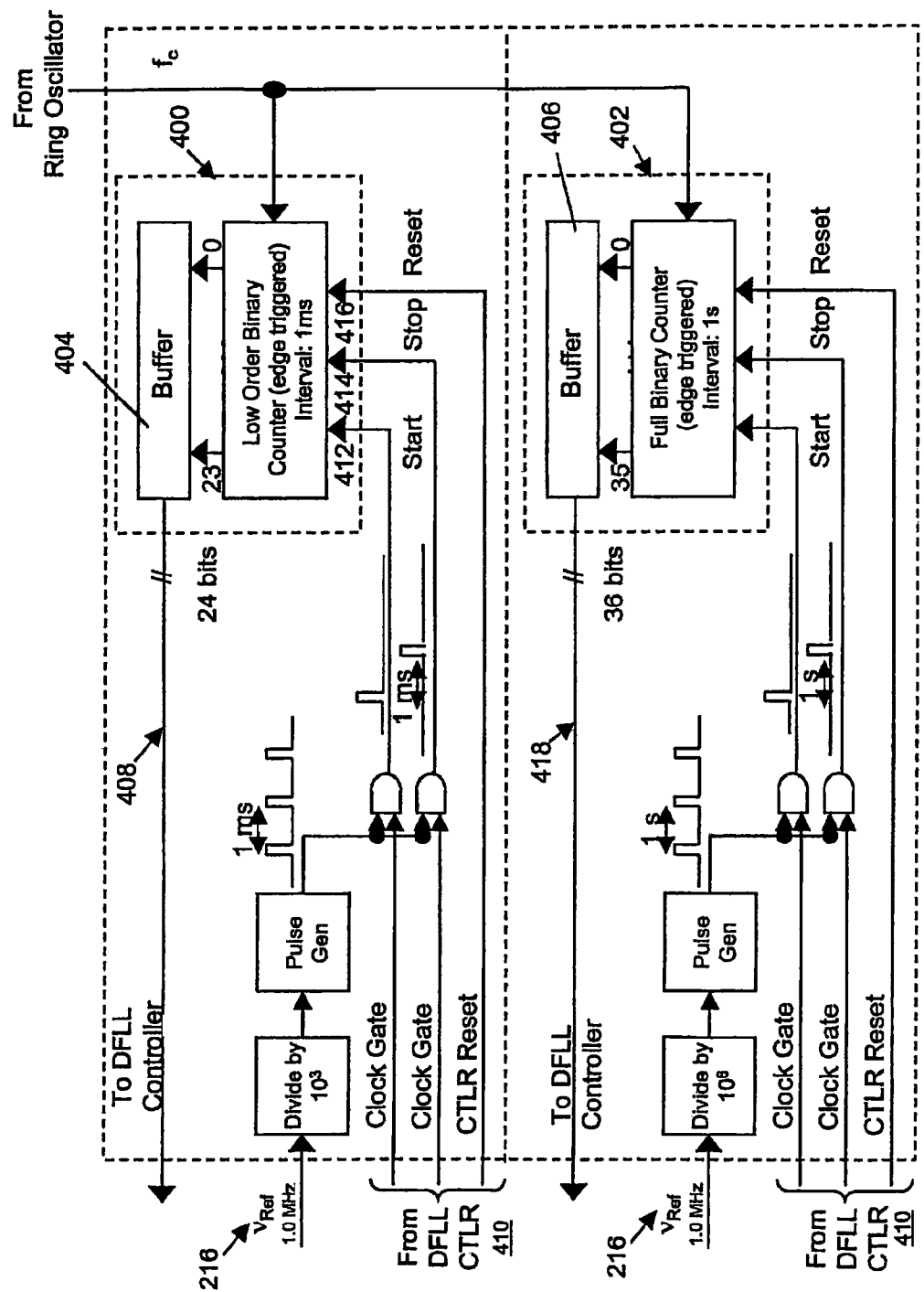
FIG. 4 illustrates a schematic of binary time interval counters of the DFLL circuit in accordance with one exemplary embodiment of the present invention.

Referring now to FIG. 4, the counting device 208 includes a low order binary counter 400 and a high order binary counter 402 in accordance with one embodiment. Of course, the counting device 208 may include only one counter being of low or high order binary in other embodiments. The low order binary counter 400 and the high order binary counter 402 include a first buffer 404 and a second buffer 406 respectively. The low order binary counter 400 and the high order binary counter 402 are configured to operate in a similar fashion, thus for ease of discussion only the low order binary counter 400 will be discussed in greater detail below.

In accordance with one embodiment, the low order binary counter 400 includes an edge-triggered multistage shift register with the output of each stage stored in the first buffer 404.

In accordance with one embodiment, the shift register includes twenty-four stages for twenty-four bits, with each stage representing one bit. The clock driving the shift register is the local core clock $f_c$ of the digitally controlled ring oscillator 206. The low order binary counter 400 generates a digital output 408 representative of the number of cycles of the local core clock 218 as established by the start and stop pulses of the shift register.

In accordance with one embodiment, the DFLL micro-controller 202 operably controls the low-order binary counter 400 through a plurality of operational signals 410 (start/stop/reset) received by a start port 412, stop port 414, and a reset port 416 of the low order binary counter 400 respectively. In particular, the DFLL micro-controller 202 gates the reference frequency $v_{ref}$ to determine the time interval desired for the count. For example, a 1 MHz reference clock $v_{ref}$ is divided by 1000 to generate a 1 kHz clock, which has a 1 ms time interval between pulses. The DFLL micro-controller 202 starts the low-binary counter 400 by allowing a single pulse into the start port 412 of the counter 400. The DFLL micro-controller stops the low binary counter 400 by allowing a following single pulse 1 ms later into the stop port of the counter 400. Consequently, the count that appears in the first buffer 404 is the number of cycles of the local core clock $f_c$, which is the output of the digitally controlled ring oscillator 206. The output of the first buffer 404 is a digital representation (digital signal 408) of the number of cycles within the time interval, which can be converted to a frequency value by the DFLL micro-controller 202 by multiplying the digital signal 408 by a 1000 in accordance with one exemplary embodiment. This is a reasonable representation of frequency value of the local core clock $f_c$ generated from the digitally controlled ring oscillator 206 based on the notion that the design of the digitally controlled ring oscillator insures stability and temperature compensation over the time interval of interest, which is a few seconds or less.

In operation, the low-binary counter 400 sends the digital signal 408 to the DFLL micro-controller 202 to be compared against the desired clock frequency. The DFLL micro-controller 202 then resets the counter (sets everything to zero) to perform a count over again, as desired. Multiple counts can be used to compare for long-term drift and adjustment, if necessary. The low-binary counter 400 measures and validates the frequency value of the local core clock 212 to ensure continuous alignment with the desired clock frequency, especially since the desired clock frequency can change at any time due to a modified customer policy.

As described above, the full-binary counter 402 operates in the same fashion as the low-order binary counter except the interval is set at 1 second. This enables a full frequency count (for 1 second), which is represented by the value of digital output 418 from the second buffer 406. Digital output 418 can also be transmitted to the DFLL micro-controller 202. The DFLL micro-controller 202 is configured to operate in the 1 ms count and the 1 second count and based on the variations that it sees over the long and short term may decides which value it will use or which counter it will operate.

Figure 5:
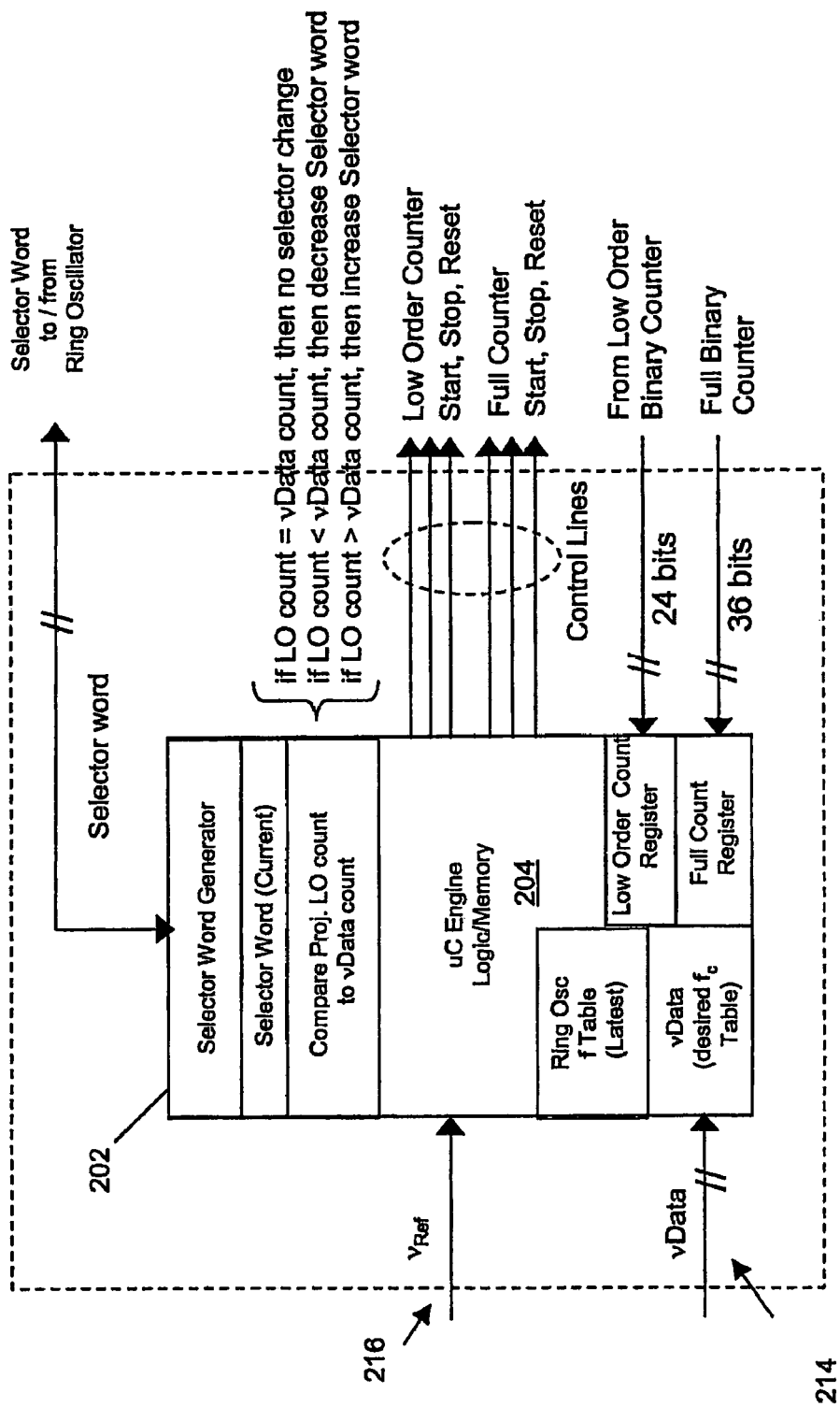
FIG. 5 illustrates a schematic of a micro-controller of the DFLL circuit in accordance with one exemplary embodiment of the present invention.
}

Now turning FIG. 5, the DFLL micro-controller 202 with local memory device 204 and state machine logic assimilates the data input 214 ($v_{data}$) and generates correction signal, which is the selector word 218 to the digitally controlled ring oscillator 206. The external inputs to the DFLL micro-controller 202 include the desired clock frequency value (e.g., desired $f_c$) from the SEEPROM and reference clock 216. In accordance with one embodiment, the frequency data (e.g., desired clock frequency value) is composed of a desired matrix of the frequencies of operation for cores in the multicore processor 100 based on customer policy in a table format in accordance with one embodiment. The digital representation of the transfer function is similarly stored in the local memory device 204 of the DFLL micro-controller 202.

In accordance with one embodiment, the DFLL micro-controller 202 receives an internal input from the digitally controlled ring oscillator 206 indicating the current selector word currently being used to generate the local core clock 212. In operation, the DFLL micro-controller 202 compares the projected (to one full second) low-order binary frequency count to the full binary frequency counter, and, if consistent uses that as the current operation value. If inconsistent, it may use the full count register value or take another low-order measurement and compare until the values correspond to within the accuracy desired. Then, the DFLL micro-controller 202 compares the projected low-order count to the desired clock frequency in the $v_{data}$ and determines if the current state or frequency value is equal, lower or higher than the desired clock frequency. The DFLL micro-controller 202 generates a new selector word based on the current selector word and the direction of (higher or lower) frequency movement that is transmitted to the digitally controlled ring oscillator 206 to adjust the frequency value of the local core clock 212 as desired. This operation is done until the desired clock frequency and the frequency value of the local core clock 212 generated by the digitally-controlled ring oscillator 206 matches or is aligned with each another.

During operation, the DFLL micro-controller 202 periodically compares desired clock frequency with the actual frequency of the local core clock 212 as measured by the binary counters to determine if and when any further adjustment is required. In other words, the DFLL micro-controller 202 continually validates the actual frequencies and the desired frequencies match. If a difference exists, it initiates a desired correction in frequency.

In accordance with one embodiment, the transfer function for local core #1 can be periodically updated (in the background) by shifting work to another core (e.g., local core #2) temporarily and once the transfer function is once again updated return work back to local core #1. At the same time, the receiving core can be speed up temporarily to account for the increased workload. These transfer function updates can be performed based on product age and environmental changes. This enables a tight correspondence between frequency and delay tap. In accordance with one embodiment, the SE can update the transfer function for each core within the multi-core processing system based on event monitoring devices within the system that monitors workload and power consumption within the system. As such, power consumption and performance can be optimized for each core individually (e.g., achieved by reducing clock frequency for particular cores within the system).

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A digital frequency locked-loop (DFLL) circuit residing on a local core of a multi-core microprocessor system for generating a local core clock with a frequency value for driving the local core, comprising:

a micro-controller configured to receive a plurality of digital data for characterizing the local core;

a digitally-controlled ring oscillator configured to generate the local core clock for the local core, the digitally-controlled ring oscillator having a delay chain disposed between an output of the digitally-controlled ring oscillator and a feedback input of the digitally-controlled ring oscillator, the delay chain having a plurality of delay taps each receiving the local core clock from the output through the feedback input of the digitally-controlled ring oscillator for enabling single or multi-step quantum changes in the frequency value of the local core clock; and a counter device configured to continually validate the frequency value of the local core clock by generating a digital signal representative of the frequency value to the micro-controller, the micro-controller compares the frequency value of the local core clock to a desired clock frequency when the micro-controller receives the digital signal from the counter device, and the micro-controller selects one of the plurality of delay taps based on the comparison to adjust the frequency value of the local core clock towards alignment with the desired clock frequency.

2. The DFLL circuit as in claim 1, wherein the plurality of digital data includes a transfer function being programmable to the digitally-controlled ring oscillator and stored in the micro-controller, the transfer function calibrates a plurality of time delays correspondingly associated with the plurality of delay taps, the plurality of time delays provide a range of clock frequencies among the plurality delay taps.

3. The DFLL circuit as in claim 2, wherein the transfer function enables the powering down of the local core and the management of workload among each local core within the multi-core microprocessor system.

4. The DFLL circuit as in claim 1, wherein the plurality of digital data includes the desired clock frequency.

5. The DFLL circuit as in claim 1, wherein the micro-controller generates a correction signal based on the comparison, the correction signal being used to select one of the plurality of delay taps.

6. The DFLL circuit as in claim 5, wherein the digitally-controlled ring oscillator includes a digital selector, the digital selector selects one of the plurality of delay taps based on the correction signal and the local core clock received by each of the plurality of delay taps.

7. The DFLL circuit as in claim 1, wherein the counter device includes a low-order binary counter and a high-order binary counter each having operations being controlled by the micro-controller.

8. The DFLL circuit as in claim 1, wherein the micro-controller is configured to receive a reference clock frequency reference for operably clocking the plurality of digital data and the counter device.

9. The DFLL circuit as in claim 1, wherein the plurality of digital data enables direct digital frequency tuning of the frequency value of the local core clock.

10. The DFLL circuit as in claim 1, wherein the micro-controller, the digitally controlled ring oscillator, and the counter device are in signal communication with one another forming a digital feedback network.

11. A method for tuning the frequency of a local core clock configured to drive a local core in a multi-core microprocessor system, the method comprising:

disposing a digital frequency locked-loop (DFLL) circuit on the local core;

generating a digital signal representative of the frequency of the local core clock to a micro-controller of the DFLL circuit when the frequency of the local core clock is validated by a counter device of the DFLL circuit;

comparing the frequency of the local core clock to a desired clock frequency when the micro-controller receives the digital signal from the counter device; and selecting one of a plurality of delay taps of a delay chain in a digitally controlled ring oscillator of the DFLL circuit based on the comparison to adjust the frequency of the local core clock towards alignment with the desired clock frequency, the plurality of delay taps each receive the local core clock from an output end of the digitally controlled ring oscillator, the plurality of delay taps enable single or multi-step quantum changes in the frequency of the local core clock.

12. The method as in claim 11, wherein the digitally controlled ring oscillator is configured to generate the local core clock for the local core.

13. The method as in claim 11, wherein the micro-controller is configured to receive a plurality of digital data for characterizing the local core.

14. The method as in claim 13, wherein the plurality of digital data includes a transfer function being programmable to the digitally-controlled ring oscillator and stored in the micro-controller, the transfer function calibrates a plurality of time delays correspondingly associated with the plurality of delay taps, the plurality of time delays provide a range of clock frequencies among the plurality delay taps.

15. The method as in claim 14, wherein the transfer function enables the powering down of the local core and the management of workload among each local core within the multi-core microprocessor system.

16. The method as in claim 13, wherein the plurality of digital data includes the desired clock frequency.

17. The method as in claim 11, wherein the micro-controller generates a correction signal based on the comparison, the correction signal being used to select one of the plurality of delay taps.

18. The method as in claim 17, wherein the digitally-controlled ring oscillator includes a digital selector, the digital selector selects one of the plurality of delay taps based on the correction signal and the local core clock received by each of the plurality of delay taps.

19. The method as in claim 11, wherein the counter device includes a low-order binary counter and a high-order binary counter each having operations being controlled by the micro-controller.

20. The method as in claim 11, wherein the plurality of digital data enables direct digital frequency tuning of the frequency of the local core clock.

* * * * *